(12) United States Patent
Wang et al.

(10) Patent No.: US 9,647,039 B1
(45) Date of Patent: May 9, 2017

(54) ARRAY SUBSTRATE, DISPLAY PANEL, DISPLAY DEVICE, AND FABRICATION METHOD THEREOF

(71) Applicants: Shanghai Tianma AM-OLED Co., Ltd., Shanghai (CN); Tianma Micro-electronics Co., Ltd., Shenzhen (CN)

(72) Inventors: Yongzhi Wang, Shanghai (CN); Zhiyong Xiong, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/149,748

(22) Filed: May 9, 2016

(30) Foreign Application Priority Data

Nov. 6, 2015 (CN) .......................... 2015 1 0749696

(51) Int. Cl.
| | |
|---|---|
| *H01L 27/12* | (2006.01) |
| *H01L 27/32* | (2006.01) |
| *H01L 51/56* | (2006.01) |
| *H01L 51/00* | (2006.01) |
| *H01L 51/50* | (2006.01) |
| *G09G 3/36* | (2006.01) |

(52) U.S. Cl.
CPC ...... *H01L 27/3218* (2013.01); *H01L 27/3262* (2013.01); *H01L 51/001* (2013.01); *H01L 51/0011* (2013.01); *H01L 51/56* (2013.01); *G09G 3/36* (2013.01); *G09G 3/364* (2013.01); *H01L 27/1214* (2013.01); *H01L 27/1259* (2013.01); *H01L 51/5012* (2013.01); *H01L 2227/323* (2013.01)

(58) Field of Classification Search
CPC . H01L 27/3218; H01L 27/3262; H01L 51/56; H01L 51/001; H01L 51/0011; H01L 51/5012; H01L 27/1214; H01L 2227/323; H01L 27/1259

USPC .......................................................... 257/40
See application file for complete search history.

(56) References Cited

U.S. PATENT DOCUMENTS

| | | | | |
|---|---|---|---|---|
| 2011/0090139 | A1* | 4/2011 | Chiang | G09G 3/3648 345/87 |
| 2014/0118657 | A1* | 5/2014 | Duan | G02F 1/136286 349/46 |
| 2016/0062196 | A1* | 3/2016 | Takahashi | G09G 3/36 349/43 |

FOREIGN PATENT DOCUMENTS

KR 1020070103616 A 6/2008

\* cited by examiner

*Primary Examiner* — Caleen Sullivan
(74) *Attorney, Agent, or Firm* — Anova Law Group, PLLC

(57) ABSTRACT

An array substrate includes a plurality of first pixel-unit columns and a plurality of second pixel-unit columns repeatedly alternating with each other along a first direction. The first pixel-unit column includes a plurality of first pixel-unit groups and a plurality of second pixel-unit groups repeatedly alternating with each other along a second direction. The second pixel-unit column includes a plurality of third pixel-unit groups and a plurality of fourth pixel-unit groups repeatedly alternating with each other along the second direction. Each of the first pixel-unit group, the second pixel-unit group, the third pixel-unit group, and the fourth pixel-unit group includes a plurality of sub-pixels arranged into a matrix. The first pixel-unit group and the second pixel-unit group have same quantities of rows and columns in one matrix. The third pixel-unit group and the fourth pixel-unit group have same quantities of rows and columns in one matrix.

14 Claims, 12 Drawing Sheets

ARRAY SUBSTRATE, DISPLAY PANEL, DISPLAY DEVICE, AND FABRICATION METHOD THEREOF

CROSS-REFERENCES TO RELATED APPLICATIONS

This application claims the priority of Chinese patent application No. 201510749696.2, filed on Nov. 6, 2015, the entirety of which is incorporated herein by reference.

FIELD OF THE DISCLOSURE

The present disclosure generally relates to the field of display technology and, more particularly, relates to an array substrate, a display panel, a display device, and fabrication process thereof.

BACKGROUND

With the development of electronic technology, electronic products have been used all over people's life. As an important aspect in the field of electronic technology, display technology may determine the display quality of electronic products.

In the field of display technology, display devices may include two categories: organic light-emitting display devices and liquid crystal display devices. Both types of display devices may include an array substrate, which contains a plurality of sub-pixels. The number of sub-pixels on an array substrate determines whether the resolution of the display device based on the array substrate is high or low. In order to meet the customer requirements on electronic products with higher resolution, the number of sub-pixels on an array substrate becomes greater without increasing the dimension of the array substrate. As a consequence, gaps between neighboring sub-pixels on the array substrate become smaller and smaller.

Because the distance between neighboring sub-pixels becomes smaller, requirements on the production process of mask plate during the fabrication of array substrate becomes higher and higher. That is, the fabrication of mask plate becomes more difficult. Therefore, the fabrication of an array substrate with more sub-pixels and the fabrication of a display device containing such an array substrate are highly challenged.

The disclosed array substrates, display panels, display devices, and the fabrication methods are directed to solve one or more problems set forth above and other problems in the art.

BRIEF SUMMARY OF THE DISCLOSURE

One aspect of the present disclosure includes an array substrate. The array substrate includes a plurality of first pixel-unit columns and a plurality of second pixel-unit columns repeatedly alternating with each other along a first direction. The first pixel-unit column further includes a plurality of first pixel-unit groups and a plurality of second pixel-unit groups repeatedly alternating with each other along a second direction, while the second pixel-unit column includes a plurality of third pixel-unit groups and a plurality of fourth pixel-unit groups repeatedly alternating with each other along the second direction. The second direction forms an angle with the first direction. Each of the first pixel-unit group, the second pixel-unit group, the third pixel-unit group, and the fourth pixel-unit group includes a plurality of sub-pixels arranged into a matrix. The first pixel-unit group and the second pixel-unit group have a same quantity of rows and a same quantity of columns in one matrix, while the third pixel-unit group and the fourth pixel-unit group have a same quantity of rows and a same quantity of columns in one matrix. Moreover, the sub-pixels in the first pixel-unit group are all first sub-pixels, the sub-pixels in the second pixel-unit group are all second sub-pixels, the sub-pixels in the third pixel-unit group include third sub-pixels and the second sub-pixels having a same quantity, and the sub-pixels in the fourth pixel-unit group include the third sub-pixels and the first sub-pixels having a same quantity.

Another aspect of the present disclosure provides a method for forming an array substrate. The method includes forming a plurality of first pixel-unit columns and forming a plurality of second pixel-unit columns repeatedly alternating with each other along a first direction. Further, the first pixel-unit column includes a plurality of first pixel-unit groups and a plurality of second pixel-unit groups repeatedly alternating with each other along a second direction, while the second pixel-unit column includes a plurality of third pixel-unit groups and a plurality of fourth pixel-unit groups repeatedly alternating with each other along the second direction. The second direction forms an angle with the first direction. Each of the first pixel-unit group, the second pixel-unit group, the third pixel-unit group, and the fourth pixel-unit group includes a plurality of sub-pixels arranged into a matrix. The first pixel-unit group and the second pixel-unit group have a same quantity of rows and a same quantity of columns in one matrix, while the third pixel-unit group and the fourth pixel-unit group have a same quantity of rows and a same quantity of columns in one matrix. Moreover, the sub-pixels in the first pixel-unit group are all first sub-pixels, the sub-pixels in the second pixel-unit group are all second sub-pixels, the sub-pixels in the third pixel-unit group include third sub-pixels and the second sub-pixels having a same quantity, and the sub-pixels in the fourth pixel-unit group include the third sub-pixels and the first sub-pixels having a same quantity.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
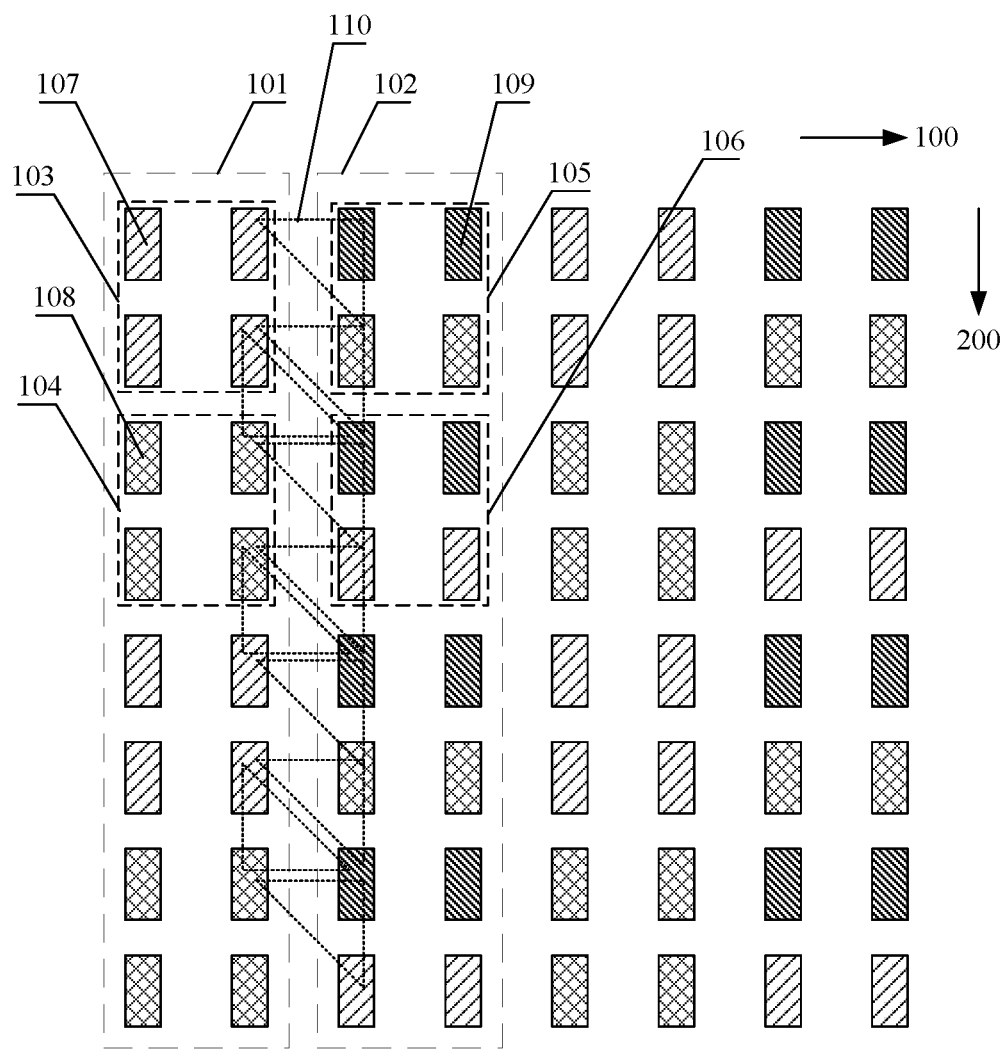
FIG. 1 illustrates a schematic top-view of an exemplary array substrate consistent with disclosed embodiments.

The present disclosure provides an array substrate. FIG. 1 shows a schematic top-view of an exemplary array substrate consistent with disclosed embodiments. Referring to FIG. 1, the array substrate includes a plurality of first pixel-unit columns 101 and a plurality of second pixel-unit columns 102. The plurality of first pixel-unit columns 101 and the plurality of second pixel-unit columns 102 may be arranged repeatedly alternating with each other along a first direction 100.

Further, each first pixel-unit column 101 may include a plurality of first pixel-unit groups 103 and a plurality of second pixel-unit groups 104. The plurality of first pixel-unit groups 103 and the plurality of second pixel-unit groups 104 may be arranged repeatedly alternating with each other along a second direction 200. Each second pixel-unit column 102 may include a plurality of third pixel-unit groups 105 and a plurality of fourth pixel-unit groups 106. The plurality of third pixel-unit groups 105 and the plurality of fourth pixel-unit groups 106 may be arranged repeatedly alternating with each other along the second direction 200. The first direction 100 and the second direction 200 may form an angle.

Moreover, each of the first pixel-unit group 103, the second pixel-unit group 104, the third pixel-unit group 105, and the fourth pixel-unit group 106 may include a plurality of sub-pixels arranged into a matrix. The number (or quantity) of rows of the matrix in each first pixel-unit group 103 may be the same as the number of rows of the matrix in each second pixel-unit group 104, while the number of columns of the matrix in each first pixel-unit group 103 may also be the same as the number of columns of the matrix in each second pixel-unit group 104. The number of rows of the matrix in each third pixel-unit group 105 may be the same as the number of rows of the matrix in each fourth pixel-unit group 106, while the number of columns of the matrix in each third pixel-unit group 105 may also be the same as the number of columns of the matrix in each fourth pixel-unit group 106. The sub-pixels in each first pixel-unit group 103 may all be first sub-pixels 107 while the sub-pixels in each second pixel-unit group 104 may all be second sub-pixels 108. The sub-pixels in each third pixel-unit group 105 may include the plurality of second sub-pixels 108 and a plurality of third sub-pixels 109. In each third pixel-unit group 105, the number of the second sub-pixels 108 may equal to the number of the third sub-pixels 109. The sub-pixels in each fourth pixel-unit group 106 may include a plurality of first sub-pixels 107 and a plurality of third sub-pixels 109. In each fourth pixel-unit group 106, the number of the first sub-pixels 107 may equal to the number of the third sub-pixels 109.

During the fabrication of exemplary organic light-emitting structures on the array substrate, the first sub-pixels 107, the second sub-pixels 108, and the third sub-pixels 109 may be separately coated with a corresponding organic light-emitting material, e.g., by an evaporation process, because different types of sub-pixels may correspond to different types of organic light-emitting material. Therefore, different mask plates may be used to coat sub-pixels with different types during the evaporation process. For example, a first mask plate may be used in a first evaporation process for coating a first type of organic light-emitting material on all of the first sub-pixels, a second mask plate may be used in a second evaporation process for coating a second type of organic light-emitting material on all of the second sub-pixels, and a third mask plate may be used in a third evaporation process for coating a third type of organic light-emitting material on all of the third sub-pixels. In other words, sub-pixels with a same type may use a same mask plate in the evaporation process, and neighboring sub-pixels with a same type may be exposed by a same opening of the corresponding mask plate.

Figure 2:
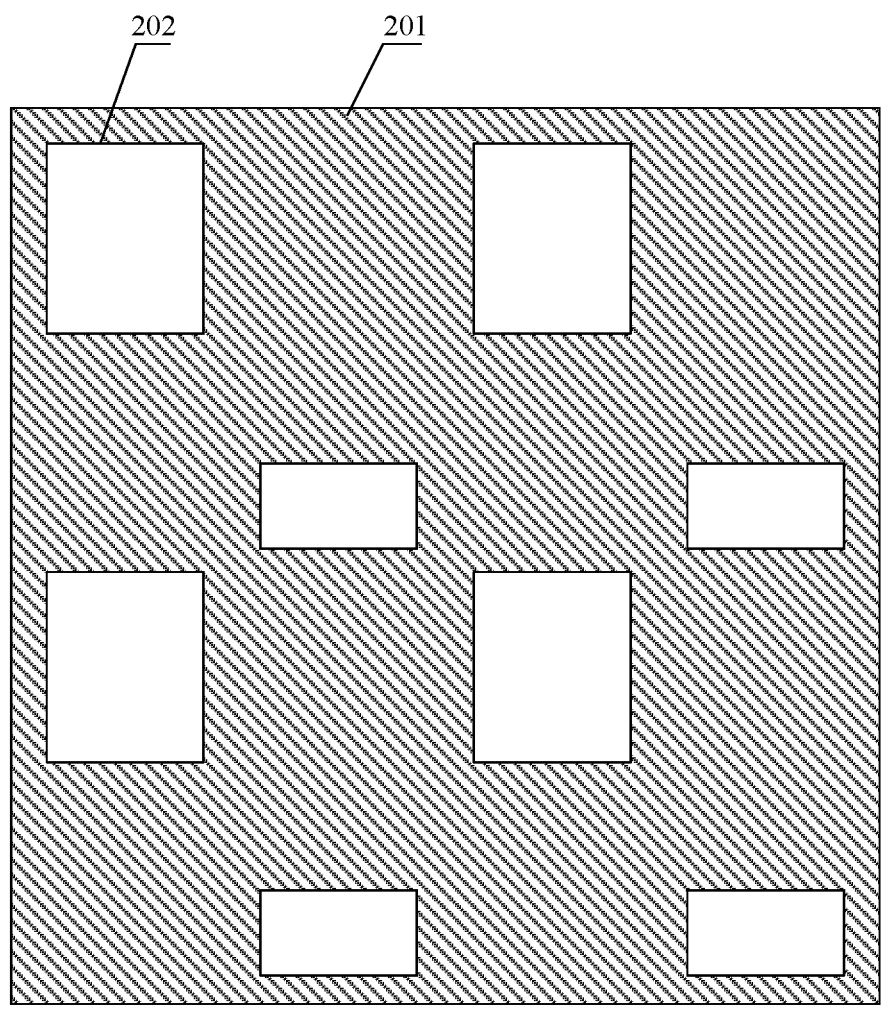
FIG. 2 illustrates a schematic top-view of a mask plate corresponding to first sub-pixels of the array substrate shown in FIG. 1.

FIG. 2 shows a schematic top-view of a mask plate corresponding to the first sub-pixels on the array substrate shown in FIG. 1. Referring to FIG. 2, the mask plate includes a substrate 201 and a plurality of openings 202 formed in the substrate 201. Specifically, the positions of the plurality of openings 202 correspond to the first sub-pixels on the array substrate shown in FIG. 1. That is, all of the first sub-pixels on the array substrate may be exposed by a same mask plate for the coating and neighboring first sub-pixels may be exposed in a same opening 202.

As illustrated above, the mask plate corresponding to the first sub-pixels sets an example for the design of mask plate consistent with disclosed embodiments. Based on FIG. 1 and FIG. 2, one may obtain the structures of mask plates corresponding to the second sub-pixels and the third sub-pixels, respectively.

Referring to FIG. 1 and FIG. 2, by setting and configuring all of the sub-pixels in the first pixel-unit group 103 as first sub-pixels 107, setting all of the sub-pixels in the second pixel-unit group 104 as second sub-pixels 108, setting a half of the sub-pixels in the third pixel-unit group 105 as the second sub-pixels 108 while the other half of the sub-pixels in the third pixel-unit group 105 as the third sub-pixels 109, and setting a half of the sub-pixels in the fourth pixel-unit group 106 as the first sub-pixels 107 while the other half of the sub-pixels in the fourth pixel-unit group 106 as the third sub-pixels 109, the specific design of the array substrate shown in FIG. 1 allows the dimensions of openings in a mask plate corresponding to a same type of sub-pixels to be relatively large while the distance between neighboring openings to be relatively long. As such, the difficulties in the fabrication process of the mask plate may be reduced. Therefore, the challenges in fabricating a display panel containing such an array substrate may also be reduced. In addition, because the distance between neighboring openings on the mask plate may be relatively long, when the mask plate is further used to form organic light-emitting material on the array substrate corresponding to the sub-pixels, trapping and alignment may be less difficult. Therefore, the probability of color mixing may be reduced and, the product yield may be improved.

Referring to FIG. 1, in one embodiment, each of the first pixel-unit group 103, the second pixel-unit group 104, the third pixel-unit group 105, and the fourth pixel-unit group 106 may include four sub-pixels arranged into a 2×2 matrix.

Specifically, the four sub-pixels in the third pixel-unit group 105 may include two third sub-pixels 109 in the first row of the 2×2 matrix and two second sub-pixels 108 in the second row of 2×2 matrix, while the four sub-pixels of the fourth pixel-unit group 106 may include two third sub-pixels 109 in the first row of the 2×2 matrix and two first sub-pixels 107 in the second row of 2×2 matrix.

Optionally, each of the first sub-pixels 107, the second sub-pixels 108, and the third sub-pixels 109 may be one of a blue sub-pixel, a green sub-pixel, and a red sub-pixel, while the first sub-pixel 107, the second sub-pixel 108, and the third sub-pixel 109 may correspond to different colors. That is, the first sub-pixel 107, the second sub-pixel 108, and the third sub-pixel 109 may be 1) a red sub-pixel, a blue sub-pixel, and a green sub-pixel, respectively; 2) a red sub-pixel, a green sub-pixel, and a blue sub-pixel, respectively; 3) a blue sub-pixel, a red sub-pixel, and a green sub-pixel, respectively; 4) a blue sub-pixel, a green sub-pixel, and a red sub-pixel, respectively; 5) a green sub-pixel, a blue sub-pixel, and a red sub-pixel, respectively; 6) or a green sub-pixel, a red sub-pixel, and a blue sub-pixel, respectively.

Further, the first sub-pixels 107, the second sub-pixels 108, and the third sub-pixels 109 may all have a rectangular shape.

Referring to FIG. 1, every three neighboring sub-pixels, including a first sub-pixel 107, a second sub-pixel 108, and a third sub-pixel 109, together may form a pixel unit 110. In addition, each neighboring pair of the pixel units 110 may share one or two of a first sub-pixel 107, a second sub-pixel 108, and a third sub-pixel 109. The dashed triangles shown in FIG. 1 indicate a plurality of pixel units 110 with each formed by a first sub-pixel 107, a second sub-pixel 108, and a third sub-pixel 109. Therefore, each pixel unit 110 may have a triangular shape. As shown in FIG. 1, six sub-pixels may form three pixel units 110 while seven sub-pixels may form four pixel units 110. According to the design, with neighboring pixel units 110 sharing one or two of a first sub-pixel 107, a second sub-pixel 108, and a third sub-pixel 109, the number of pixel units 110 formed by a certain number of sub-pixels may be relatively large. Therefore, without increasing the number of sub-pixels, the total number of pixels per inch (PPI) on the array substrate may be increased. As a result, the resolution may be improved and the display performance may also be improved.

In addition, each of the first pixel-unit group 103, the second pixel-unit group 104, the third pixel-unit group 105, and the fourth pixel-unit group 106 may include four sub-pixels arranged into a 2×2 matrix. Being arranged into such a 2×2 matrix, each sub-pixel may not be overly shared by different pixel units 110, and the lifetime thereof in the array substrate may be less affected.

On the array substrate shown in FIG. 1, neighboring first pixel-unit group 103 and third pixel-unit group 105 may be arranged in line with each other along the first direction 100 while neighboring second pixel-unit group 104 and fourth pixel-unit group 106 may also be arranged in line with each other along the first direction 100.

Optionally, as shown in FIG. 1, the first direction 100 may be perpendicular to the second direction 200, although any angles may be formed there-between according to various embodiments. In one embodiment, sub-pixels may be arranged along two mutually perpendicular directions.

Figure 3:
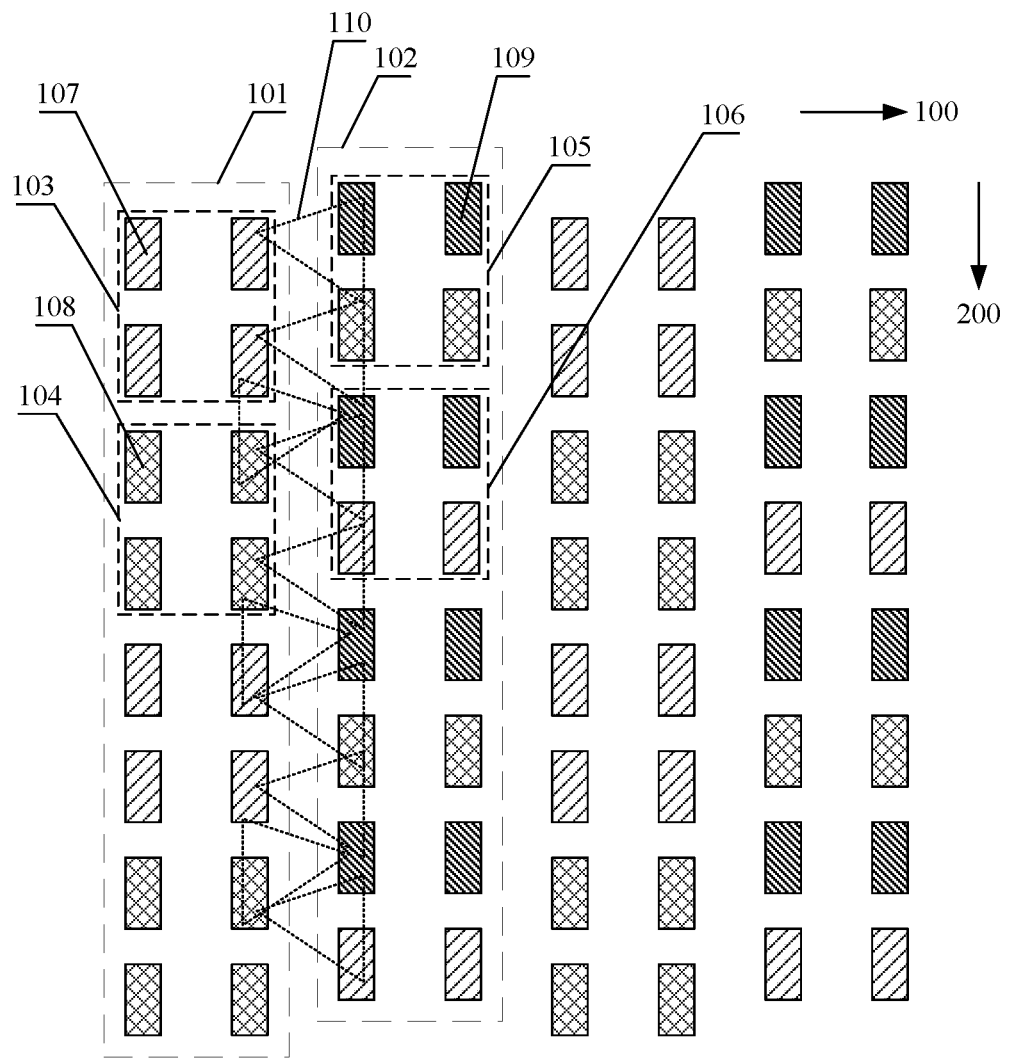
FIG. 3 illustrates a schematic top-view of another exemplary array substrate consistent with disclosed embodiments.

FIG. 3 shows a schematic top-view of another exemplary array substrate consistent with disclosed embodiments. Referring to FIG. 3, as compared to the array substrate shown in FIG. 1, the array substrate shown in FIG. 3 has the first pixel-unit groups 103 and the third pixel-unit groups 105 arranged alternatingly along virtual broken lines, such as virtual zigzag lines along a first direction 100, while the second pixel-unit groups 104 and the fourth pixel-unit groups 106 arranged alternatingly along virtual broken lines, such as virtual zigzag lines along a first direction 100.

Figure 4:
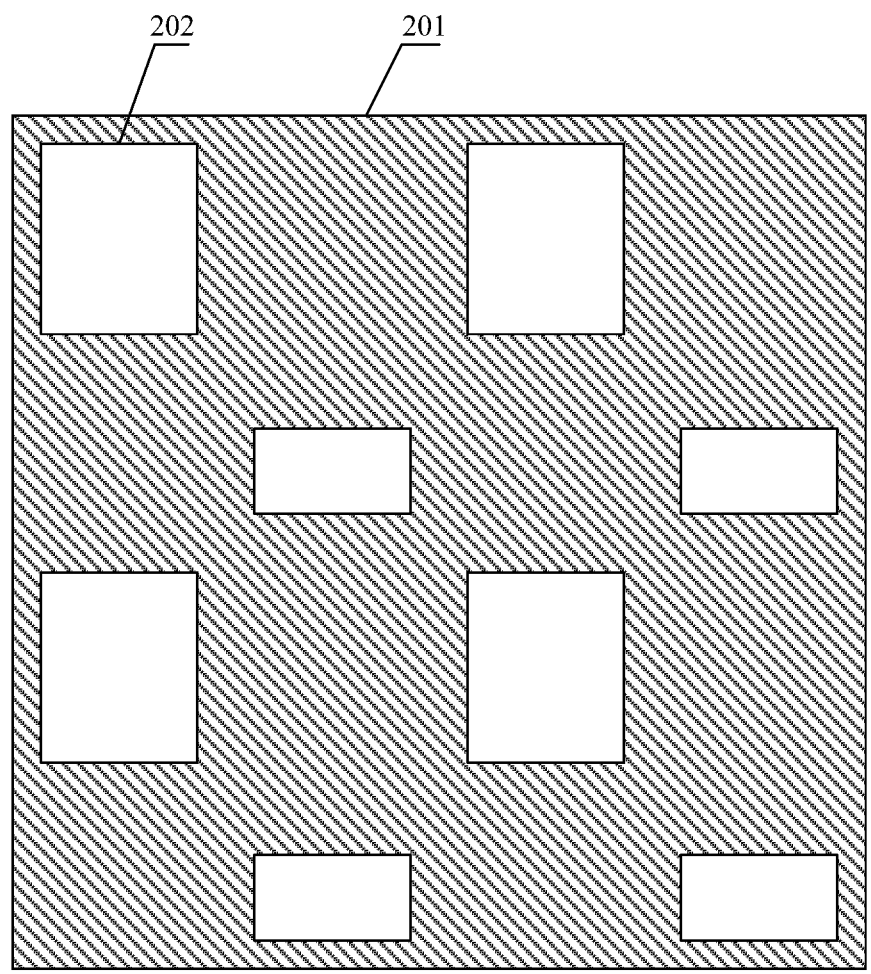
FIG. 4 illustrates a schematic top-view of a mask plate corresponding to first sub-pixels of the array substrate shown in FIG. 3.

FIG. 4 shows a schematic top-view of a mask plate corresponding to first sub-pixels of the array substrate shown in FIG. 3. Referring to FIG. 4, the mask plate includes a substrate 201 and a plurality of openings 202 formed in the substrate 201. Specifically, the positions of the plurality of openings 202 correspond to the first sub-pixels on the array substrate shown in FIG. 3. That is, all the first sub-pixels on the array substrate may be exposed by a same mask plate for the coating and neighboring first sub-pixels may be exposed in a same opening 202.

Referring to FIG. 4 and FIG. 2, compared to the mask plate shown in FIG. 2, the mask plate shown in FIG. 4 includes more uniformly distributed openings 202. That is, the distances between neighboring openings 202 are more uniformly distributed on the mask plate shown in FIG. 4.

As illustrated above, the mask plate corresponding to the first sub-pixels sets an example for the design of mask plate consistent with disclosed embodiments. Based on FIG. 3 and FIG. 4, one may obtain the structures of mask plates corresponding to the second sub-pixels and the third sub-pixels, respectively.

Referring to FIG. 3 and FIG. 4, by arranging neighboring first pixel-unit groups 103 and third pixel-unit groups 105 according to virtual zigzag lines along the first direction 100 and also arranging neighboring second pixel-unit groups 104 and fourth pixel-unit groups 106 according to virtual zigzag lines along the first direction 100, the specific design of the array substrate shown in FIG. 3 allows the distances between neighboring openings in a mask plate corresponding to a same type of sub-pixels to be more uniformly distributed. As such, the difficulties in the fabrication process of the mask plate may be reduced. Further, when the mask plate is used to form organic light-emitting material on the array substrate corresponding to the sub-pixels, trapping and alignment may be less difficult. Therefore, the probability of color mixing may be reduced and the product yield may be improved.

Specifically, the design of the array substrate shown in FIG. 3 increases the distance from a second sub-pixel 108 in a second pixel-unit group 104 to a second sub-pixel 108 in an adjacent third pixel-unit group 105, thus to simplify the fabrication process for the mask plate used to form organic light-emitting material on the array substrate corresponding to the second sub-pixels 108.

Figure 5:
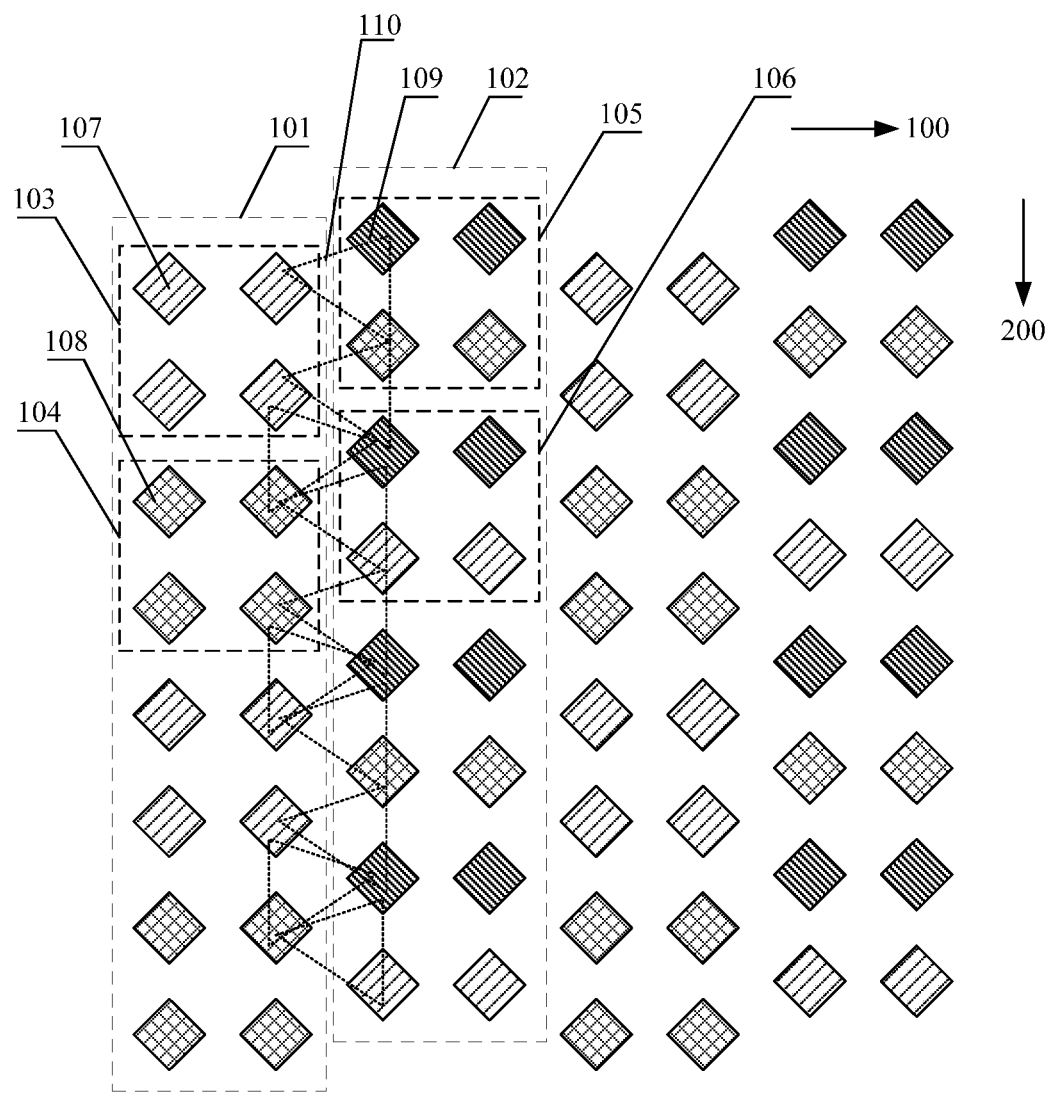
FIG. 5 illustrates a schematic top-view of another exemplary array substrate consistent with disclosed embodiments.

FIG. 5 shows a schematic top-view of another exemplary array substrate consistent with disclosed embodiments. Referring to FIG. 5, different from the situation on the array substrate shown in FIG. 3, on the array substrate shown in FIG. 5, the first sub-pixels 107, the second sub-pixels 108, and the third sub-pixels 109 may all have a diamond shape.

Referring to FIG. 5 and FIG. 3, compared to the array substrate shown in FIG. 3, by setting or configuring the first sub-pixels 107, the second sub-pixels 108, and the third sub-pixels 109 into a diamond shape, the array substrate shown in FIG. 5 allows a larger distance between sub-pixels of a same type in neighboring pixel-unit groups (for example, the distance between a second sub-pixel 108 in a second pixel-unit group 104 and a second sub-pixel 108 in an adjacent third pixel-unit group 105). Therefore, the fabrication process for mask plate corresponding to the array substrate shown in FIG. 5 may be even simpler, and the difficulties in the fabrication process may be even lower. In addition, when the mask plate is further used to form organic light-emitting material on the array substrate corresponding to the sub-pixels, trapping and alignment may be less difficult. Therefore, the probability of color mixing may be further reduced and product yield may also be further improved.

Moreover, on the array substrate shown in FIG. 5, neighboring first pixel-unit groups 103 and third pixel-unit groups 105 are arranged according to virtual zigzag lines along the first direction 100, while neighboring second pixel-unit groups 104 and fourth pixel-unit groups 106 are also arranged according to virtual zigzag lines along the first direction 100. In other embodiments, neighboring first pixel-unit groups 103 and third pixel-unit groups 105 may be arranged in line with each other to form straight lines along the first direction 100, while neighboring second pixel-unit groups 104 and fourth pixel-unit groups 106 may also be arranged in line with each other to form straight lines along the first direction 100.

Figure 6:
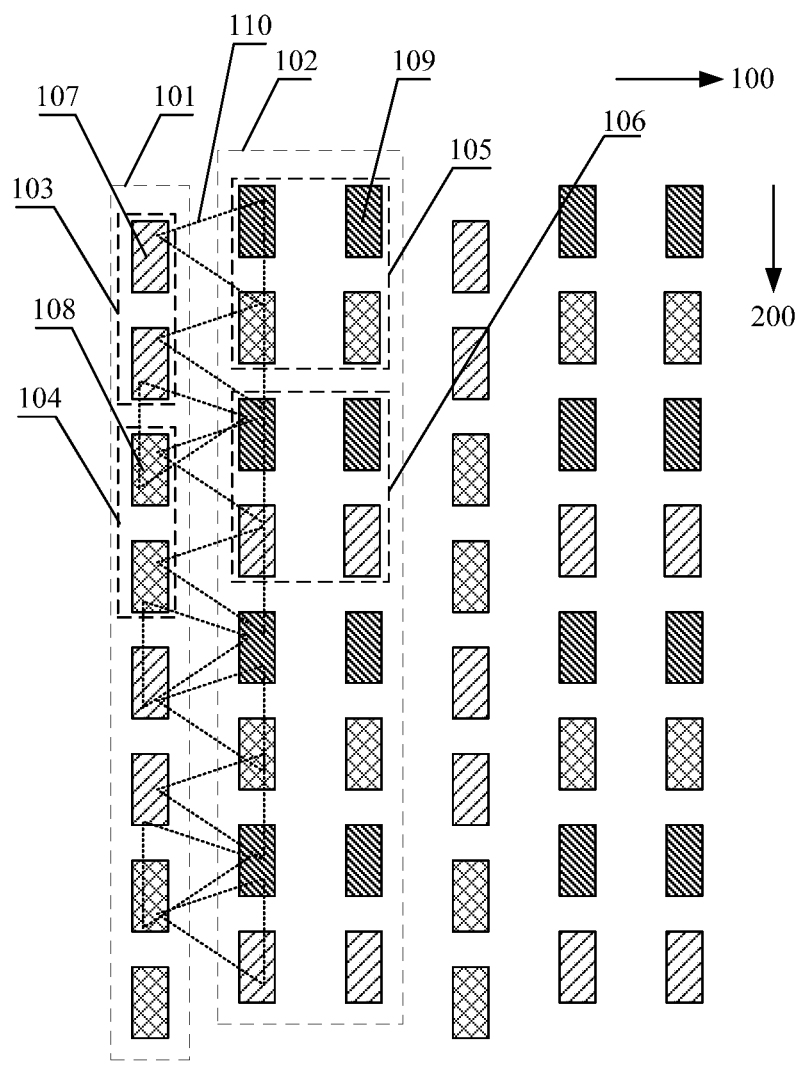
FIG. 6 illustrates a schematic top-view of another exemplary array substrate consistent with disclosed embodiments.

FIG. 6 shows a schematic top-view of another exemplary array substrate consistent with disclosed embodiments. Referring to FIG. 6, different from the situation on the array substrate shown in FIG. 3, on the array substrate shown in FIG. 6, each of the first pixel-unit groups 103 and the second pixel-unit groups 104 may include two sub-pixels arranged into a 2×1 matrix. The two sub-pixels in each first pixel-unit group 103 may be both first sub-pixels 107, while the two sub-pixels in each second pixel-unit group 104 may be both second sub-pixels 108.

Different from the situation on the array substrate shown in FIG. 3, on the array substrate shown in FIG. 6, each sub-pixel in a first pixel-unit column 101, formed by alternatingly arranging the first pixel-unit groups 103 and the second pixel-unit groups 104 along the second direction 200, may be combined with neighboring sub-pixels in an adjacent second pixel-unit column 102 to form a pixel unit. Therefore, with a certain amount of sub-pixels, the total number of pixel units formed by the sub-pixels may be relatively large. Thus, without increasing the number of sub-pixels, the number of PPI on the array substrate may be increased. As a result, the resolution may be improved and the display performance may also be improved.

Moreover, on the array substrate shown in FIG. 6, neighboring first pixel-unit groups 103 and third pixel-unit groups 105 are arranged according to virtual zigzag lines along the first direction 100, while neighboring second pixel-unit groups 104 and fourth pixel-unit groups 106 are also arranged according to virtual zigzag lines along the first direction 100. In other embodiments, neighboring first pixel-unit groups 103 and third pixel-unit groups 105 may be arranged in line with each other to form straight lines along the first direction 100, while neighboring second pixel-unit groups 104 and fourth pixel-unit groups 106 may also be arranged in line with each other to form straight lines along the first direction 100.

Figure 7:
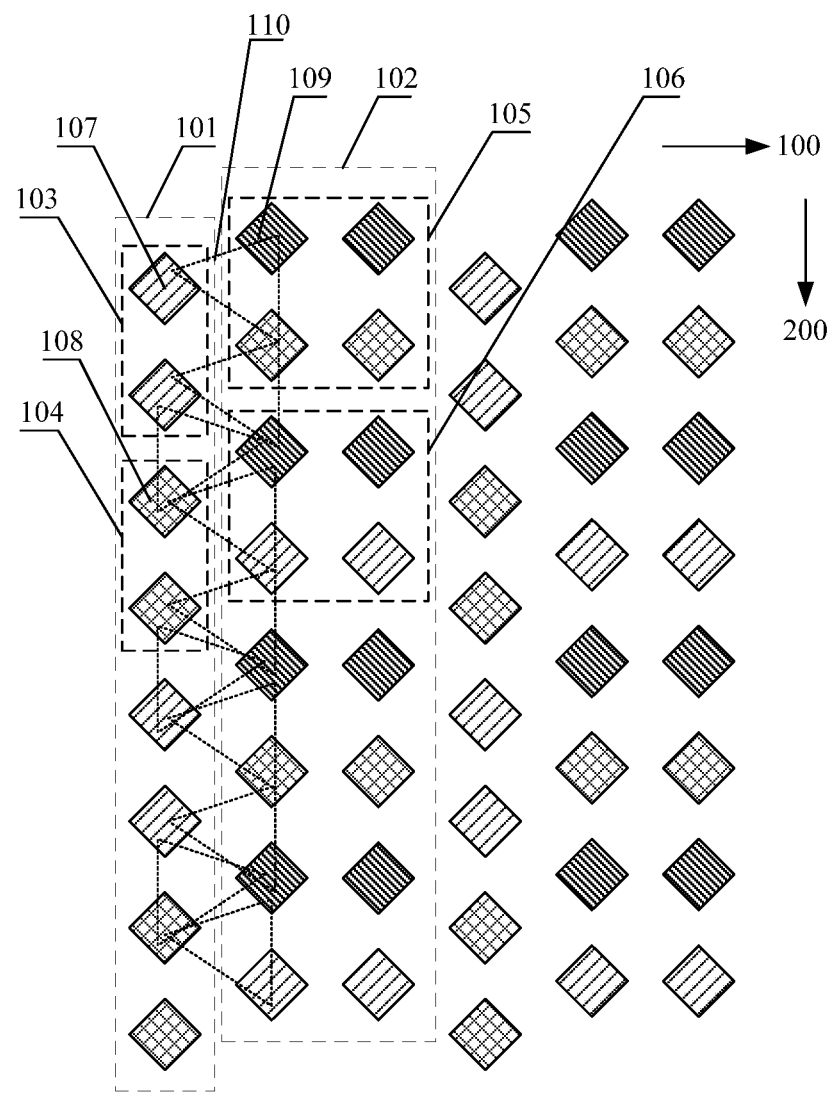
FIG. 7 illustrates a schematic top-view of another exemplary array substrate consistent with disclosed embodiments.

FIG. 7 shows a schematic top-view of another exemplary array substrate consistent with disclosed embodiments. Referring to FIG. 7, different from the situation on the array substrate shown in FIG. 6, on the array substrate shown in FIG. 7, the first sub-pixels 107, the second sub-pixels 108, and the third sub-pixels 109 may all have a diamond shape.

Referring to FIG. 7 and FIG. 6, compared to the rectangular shape of the sub-pixels shown in FIG. 6, a diamond shape is adopted for each of the first sub-pixels 107, the second sub-pixels 108, and third sub-pixels 109 shown in FIG. 7. Therefore, the distance between sub-pixels of a same type in neighboring pixel-unit groups (for example, the distance between a second sub-pixel 108 in a second pixel-unit group 104 and a second sub-pixel 108 in an adjacent third pixel-unit group 105) may be increased. Thus, the fabrication process for mask plate corresponding to the array substrate shown in FIG. 7 may be even simpler, and the difficulties in the fabrication process may be even lower. In addition, when the mask plate is further used to form organic light-emitting material on the array substrate corresponding to the sub-pixels, trapping and alignment may be less difficult. Therefore, the probability of color mixing may be further reduced and product yield may also be further improved.

Moreover, on the array substrate shown in FIG. 7, neighboring first pixel-unit groups 103 and third pixel-unit groups 105 are arranged according to virtual zigzag lines along the first direction 100, while neighboring second pixel-unit groups 104 and fourth pixel-unit groups 106 are also arranged according to virtual zigzag lines along the first direction 100. In other embodiments, neighboring first pixel-unit groups 103 and third pixel-unit groups 105 may be arranged in line with each other to form straight lines along the first direction 100, while neighboring second pixel-unit groups 104 and fourth pixel-unit groups 106 may also be arranged in line with each other to form straight lines along the first direction 100.

Figure 8:
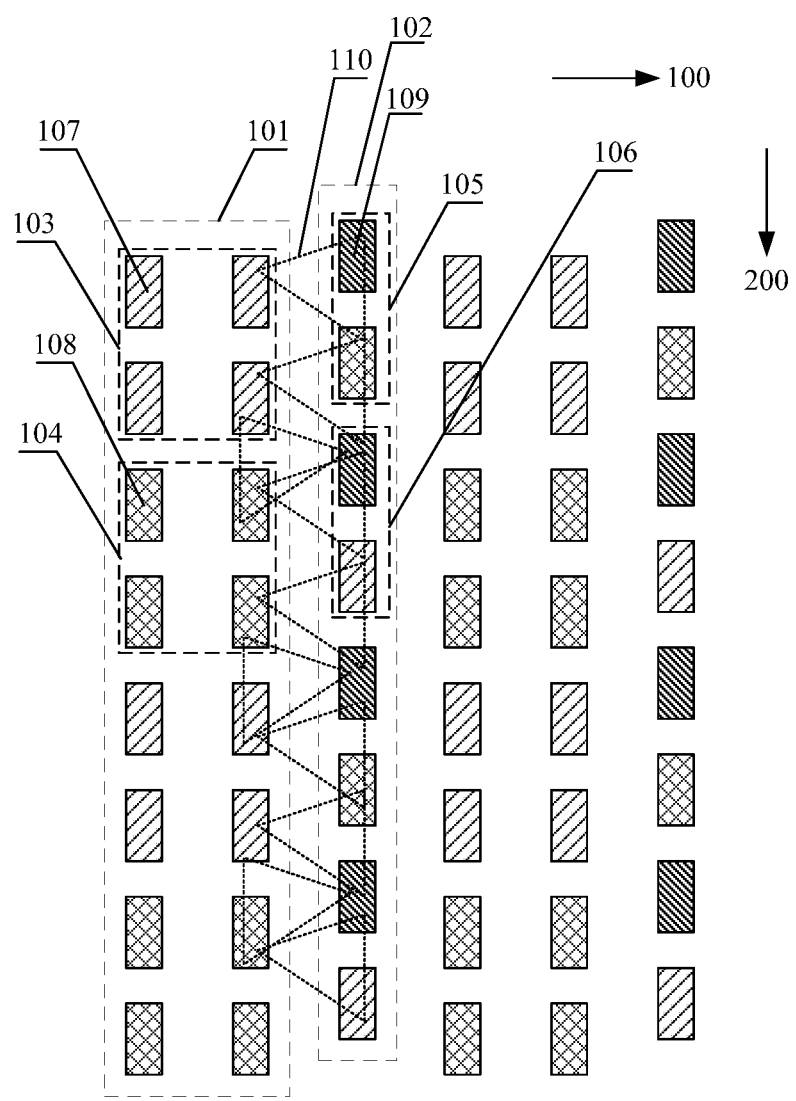
FIG. 8 illustrates a schematic top-view of another exemplary array substrate consistent with disclosed embodiments.

FIG. 8 shows a schematic top-view of another exemplary array substrate consistent with disclosed embodiments. Referring to FIG. 8, different from the situation on the array substrate shown in FIG. 3, on the array substrate shown in FIG. 8, each of the third pixel-unit groups 105 and the fourth pixel-unit groups 106 may include two sub-pixels arranged into a 2×1 matrix. The two sub-pixels in each third pixel-unit group 105 may be a third sub-pixel 109 arranged on the first row of the 2×1 matrix and a second sub-pixel 108 arranged on the second row of the 2×1 matrix; while the two sub-pixels in each fourth pixel-unit group 106 may be a third sub-pixel 109 arranged on the first row of the 2×1 matrix and a first sub-pixel 107 arranged on the second row of the 2×1 matrix.

Different from the situation on the array substrate shown in FIG. 3, on the array substrate shown in FIG. 8, each sub-pixel in a second pixel-unit column 102, formed by alternatingly arranging the third pixel-unit groups 105 and the fourth pixel-unit groups 106 along the second direction 200, may be combined with neighboring sub-pixels in an adjacent first pixel-unit column 101 to form a pixel unit. Therefore, with a certain amount of sub-pixels, the total number of pixel units formed by the sub-pixels may be relatively large. Thus, without increasing the number of sub-pixels, the number of PPI on the array substrate may be increased. As a result, the resolution may be improved and the display performance may also be improved.

Moreover, on the array substrate shown in FIG. 8, neighboring first pixel-unit groups 103 and third pixel-unit groups 105 are arranged according to virtual zigzag lines along the first direction 100, while neighboring second pixel-unit groups 104 and fourth pixel-unit groups 106 are also arranged according to virtual zigzag lines along the first direction 100. In other embodiments, neighboring first pixel-unit groups 103 and third pixel-unit groups 105 may be arranged in line with each other to form straight lines along the first direction 100, while neighboring second pixel-unit groups 104 and fourth pixel-unit groups 106 may also be arranged in line with each other to form straight lines along the first direction 100.

Figure 9:
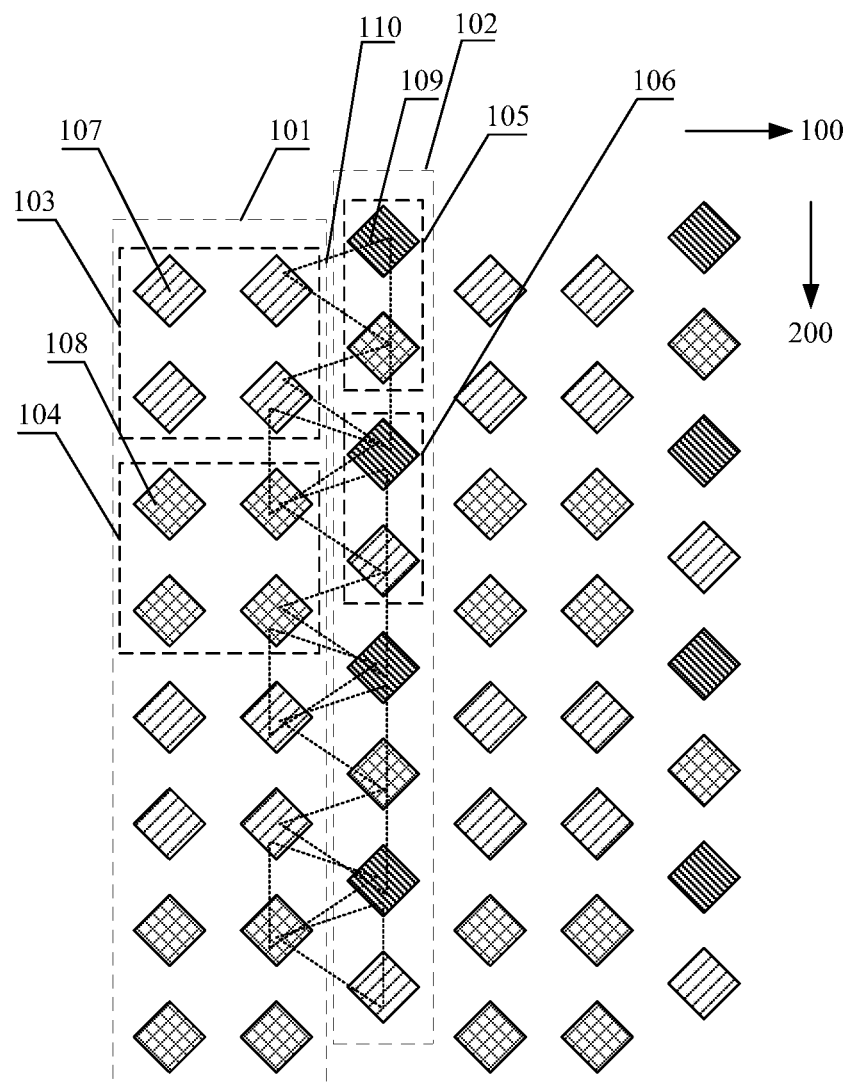
FIG. 9 illustrates a schematic top-view of another exemplary array substrate consistent with disclosed embodiments.

FIG. 9 shows a schematic top-view of another exemplary array substrate consistent with disclosed embodiments. Referring to FIG. 9, different from the situation on the array substrate shown in FIG. 8, on the array substrate shown in FIG. 9, the first sub-pixels 107, the second sub-pixels 108, and the third sub-pixels 109 may all have a diamond shape.

Referring to FIG. 9 and FIG. 8, compared to the array substrate shown in FIG. 8, by setting the first sub-pixels 107, the second sub-pixels 108, and the third sub-pixels 109 into a diamond shape, the array substrate shown in FIG. 9 allows a larger distance between sub-pixels of a same type in neighboring pixel-unit groups (for example, the distance between a second sub-pixel 108 in a second pixel-unit group 104 and a second sub-pixel 108 in an adjacent third pixel-unit group 105). Therefore, the fabrication process for mask plate corresponding to the array substrate shown in FIG. 9 may be even simpler, and the difficulties in the fabrication process may be even lower. In addition, when the mask plate is further used to form organic light-emitting material on the array substrate corresponding to the sub-pixels, trapping and alignment may be less difficult. Therefore, the probability of color mixing may be further reduced and product yield may also be further improved.

Moreover, on the array substrate shown in FIG. 9, neighboring first pixel-unit groups 103 and third pixel-unit groups 105 are arranged according to virtual zigzag lines along the first direction 100, while neighboring second pixel-unit groups 104 and fourth pixel-unit groups 106 are also arranged according to virtual zigzag lines along the first direction 100. In other embodiments, neighboring first pixel-unit groups 103 and third pixel-unit groups 105 may be arranged in line with each other to form straight lines along the first direction 100, while neighboring second pixel-unit groups 104 and fourth pixel-unit groups 106 may also be arranged in line with each other to form straight lines along the first direction 100.

Figure 10:
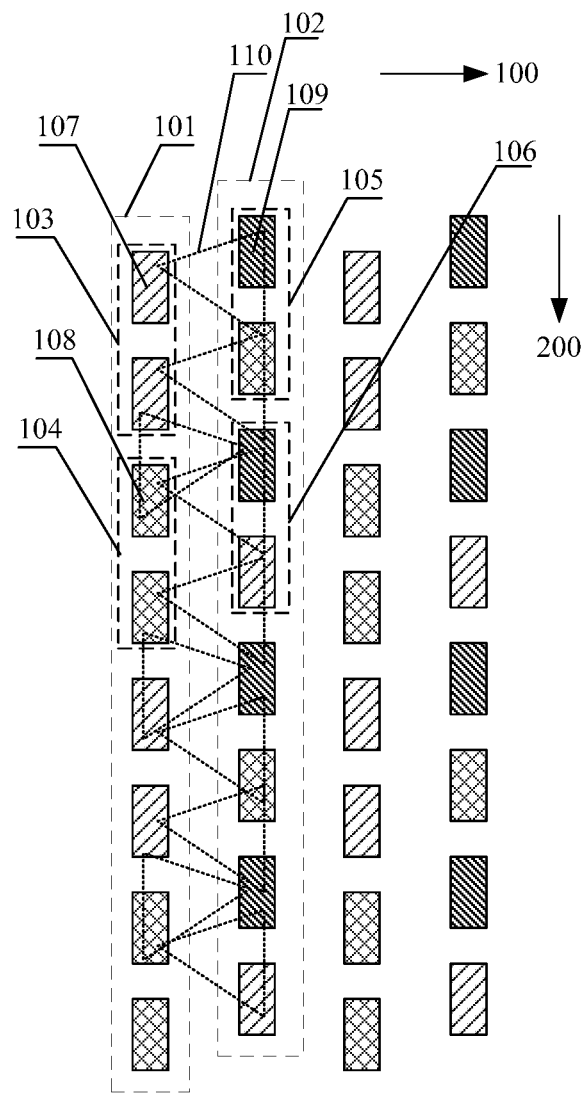
FIG. 10 illustrates a schematic top-view of another exemplary array substrate consistent with disclosed embodiments.

FIG. 10 shows a schematic top-view of another exemplary array substrate consistent with disclosed embodiments. Referring to FIG. 10, different from the situation on the array substrate shown in FIG. 3, on the array substrate shown in FIG. 10, each of the first pixel-unit groups 103, the second pixel-unit groups 104, the third pixel-unit groups 105, and the fourth pixel-unit groups 106 may include two sub-pixels arranged into a 2×1 matrix. The two sub-pixels in each first pixel-unit group 103 may be both first sub-pixels 107; the two sub-pixels in each second pixel-unit group 104 may be both second sub-pixels 108; the two sub-pixels in each third pixel-unit group 105 may be a third sub-pixel 109 arranged on the first row of the 2×1 matrix and a second sub-pixel 108 arranged on the second row of the 2×1 matrix; while the two sub-pixels in each fourth pixel-unit group 106 may be a third sub-pixel 109 arranged on the first row of the 2×1 matrix and a first sub-pixel 107 arranged on the second row of the 2×1 matrix.

On the array substrate shown in FIG. 10, each sub-pixel in a first pixel-unit column 101 may be combined with neighboring sub-pixels in an adjacent second pixel-unit column 102 to form a pixel unit. Therefore, with a certain amount of sub-pixels, the total number of pixel units formed by the sub-pixels may be relatively large. Thus, without increasing the number of sub-pixels, the number of PPI on the array substrate may be increased. As a result, the resolution may be improved and the display performance may also be improved.

Moreover, on the array substrate shown in FIG. 10, neighboring first pixel-unit groups 103 and third pixel-unit groups 105 are arranged in according to virtual to zigzag lines along the first direction 100, while neighboring second pixel-unit groups 104 and fourth pixel-unit groups 106 are also arranged according to virtual zigzag lines along the first direction 100. In other embodiments, neighboring first pixel-unit groups 103 and third pixel-unit groups 105 may be arranged in line with each other to form straight lines along the first direction 100, while neighboring second pixel-unit groups 104 and fourth pixel-unit groups 106 may also be arranged in line with each other to form straight lines along the first direction 100.

Figure 11:
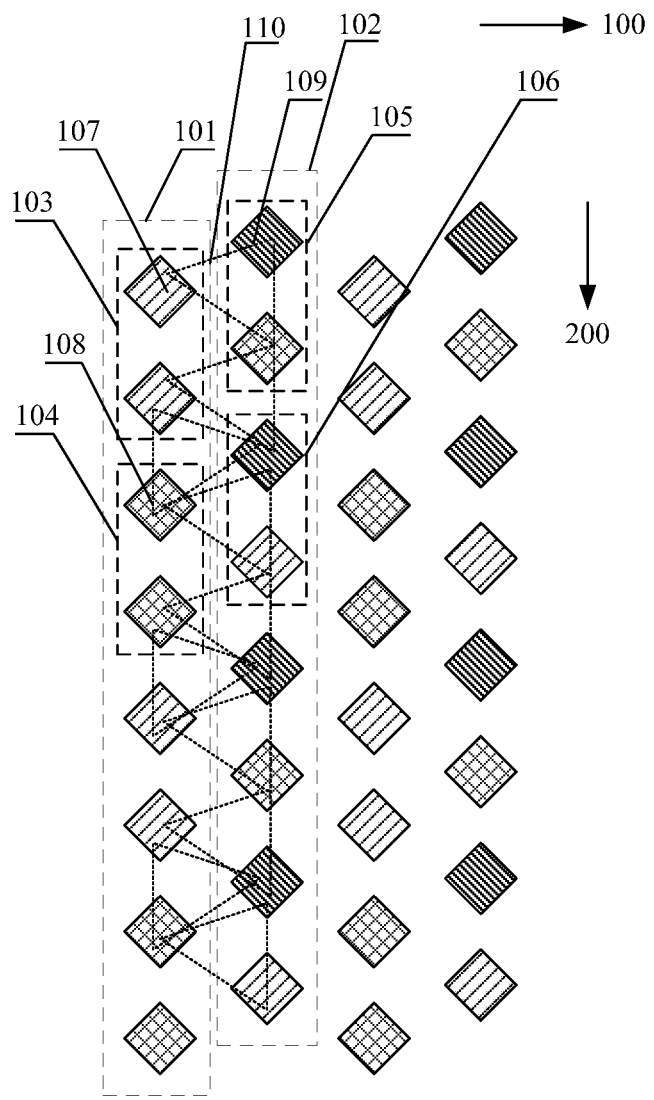
FIG. 11 illustrates a schematic top-view of another exemplary array substrate consistent with disclosed embodiments.

FIG. 11 shows a schematic top-view of another exemplary array substrate consistent with disclosed embodiments. Referring to FIG. 11, different from the situation on the array substrate shown in FIG. 10, on the array substrate shown in FIG. 11, the first sub-pixels 107, the second sub-pixels 108, and the third sub-pixels 109 may all have a diamond shape.

Referring to FIG. 11 and FIG. 10, compared to the array substrate shown in FIG. 10, by setting the first sub-pixels 107, the second sub-pixels 108, and the third sub-pixels 109 into a diamond shape, the array substrate shown in FIG. 11 allows a larger distance between sub-pixels of a same type in neighboring pixel-unit groups (for example, the distance between a second sub-pixel 108 in a second pixel-unit group 104 and a second sub-pixel 108 in an adjacent third pixel-unit group 105). Therefore, the fabrication process for mask plate corresponding to the array substrate shown in FIG. 11 may be even simpler, and the difficulties in the fabrication process may be even lower. In addition, when the mask plate is further used to form organic light-emitting material on the array substrate corresponding to the sub-pixels, trapping and alignment may be less difficult. Therefore, the probability of color mixing may be further reduced and product yield may also be further improved.

Moreover, on the array substrate shown in FIG. 11, neighboring first pixel-unit groups 103 and third pixel-unit groups 105 are arranged according to virtual zigzag lines along the first direction 100, while neighboring second pixel-unit groups 104 and fourth pixel-unit groups 106 are also arranged according to virtual zigzag lines along the first direction 100. In other embodiments, neighboring first pixel-unit groups 103 and third pixel-unit groups 105 may be arranged in line with each other to form straight lines along the first direction 100, while neighboring second pixel-unit groups 104 and fourth pixel-unit groups 106 may also be arranged in line with each other to form straight lines along the first direction 100.

For illustration purpose, array substrates in the present disclosure are described to be used in organic light-emitting display devices. However, the disclosed array substrates may also be used in other types of display devices, such as liquid crystal display devices.

Figure 12:
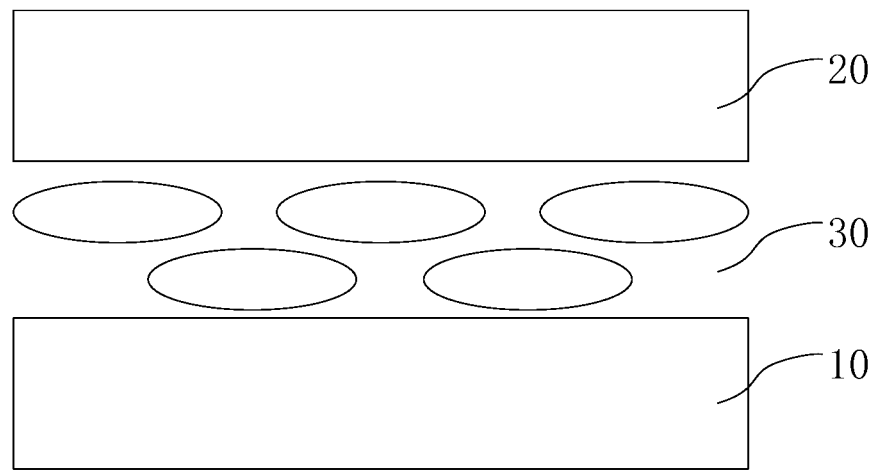
FIG. 12 illustrates a schematic view of another exemplary display panel consistent with disclosed embodiments.

Further, the present disclosure also provides a display panel. The display panel includes an array substrate consistent with disclosed embodiments described above. As an example, shown in FIG. 12, a liquid crystal display panel includes an array substrate 10 consistent with above disclosed embodiments and a color film substrate 20. In addition, the liquid crystal display panel also includes a liquid crystal layer 30 between the array substrate 10 and the color film substrate 20. In other embodiments, the display panel may be an organic light-emitting display panel or any other appropriate display panel.

Figure 13:
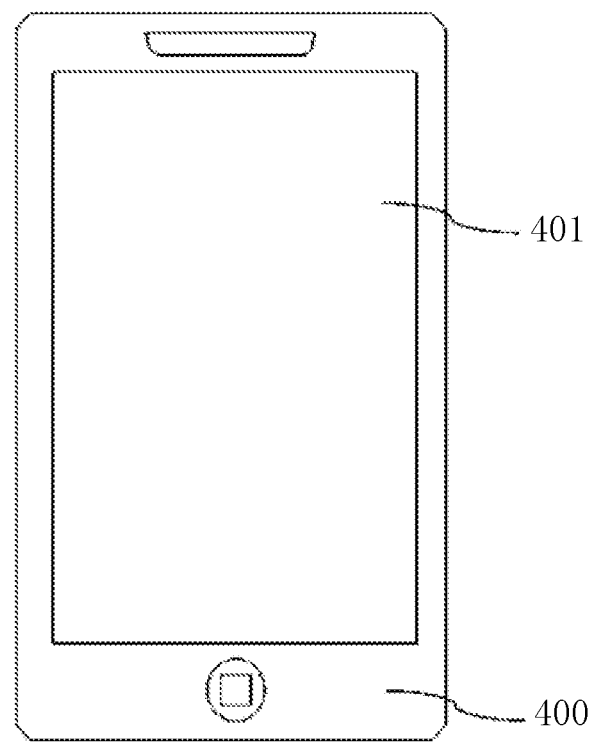
FIG. 13 illustrates a schematic view of another exemplary display device consistent with disclosed embodiments.

Moreover, the present disclosure also provides a display device. The display device includes a display panel consistent with disclosed embodiments. As an example, shown in FIG. 13, a cellphone device 400 includes the above described display panel 401. In other embodiments, the disclosed display panel may also be adopted in devices with display screens, such as television, computer monitor, etc. The display device may be an organic light-emitting display device, a liquid crystal display device, or any other display device using a display panel containing an array substrate consistent with disclosed embodiments.

According to the disclosed array substrate, a plurality of first pixel-unit columns and a plurality of second pixel-unit columns are arranged alternatingly on the array substrate along a first direction. Each first pixel-unit column further includes alternatingly arranged a plurality of first pixel-unit groups and a plurality of second pixel-unit groups while each second pixel-unit column includes alternatingly arranged a plurality of third pixel-unit groups and a plurality of fourth pixel-unit groups. Each of the first pixel-unit group, the second pixel-unit group, the third pixel-unit group, and the fourth pixel-unit group may include a plurality of sub-pixels arranged into a matrix. In addition, the number of the rows of the matrix in the first pixel-unit group equals to the number of the rows of the matrix in the second pixel-unit group and the number of the columns of the matrix in the first pixel-unit group equals to the number of the columns of the matrix in the second pixel-unit group; while the number of the rows of the matrix in the third pixel-unit group equals to the number of the rows of the matrix in the fourth pixel-unit group and the number of the columns of the matrix in the third pixel-unit group equals to the number of the columns of the matrix in the fourth pixel-unit group. All of the sub-pixels in each first pixel-unit group are first sub-pixels; all of the sub-pixels in each second pixel-unit group are second sub-pixels; a half of the sub-pixels in each third pixel-unit group are second sub-pixels and the other half of the sub-pixels in each third pixel-unit group are third sub-pixels; while a half of the sub-pixels in each fourth pixel-unit group are first sub-pixels and the other half of the sub-pixels in each fourth pixel-unit group are third sub-pixels. To fabricate an organic light-emitting display device containing the array substrate, the openings formed in a mask plate used to coat an organic light-emitting material on the array substrate corresponding to one type of sub-pixels may be relatively large and the distance between neighboring openings in the mask plate may also be relatively long. As such, the difficulties in the fabrication process of the mask plate may be reduced. Therefore, the challenges in fabricating a display panel containing such an array substrate as well as the challenges in fabricating a display device containing such a display panel may also be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An array substrate, comprising:
a plurality of first pixel-unit columns; and
a plurality of second pixel-unit columns, repeatedly alternating with the plurality of first pixel-unit columns along a first direction, wherein:
the first pixel-unit column includes a plurality of first pixel-unit groups and a plurality of second pixel-unit groups, repeatedly alternating with each other along a second direction,
the second pixel-unit column includes a plurality of third pixel-unit groups and a plurality of fourth pixel-unit groups, repeatedly alternating with each other along the second direction, the second direction forming an angle with the first direction,
each of the first pixel-unit group, the second pixel-unit group, the third pixel-unit group, and the fourth pixel-unit group includes a plurality of sub-pixels arranged into a matrix,
the first pixel-unit group and the second pixel-unit group have a same quantity of rows and a same quantity of columns in one matrix,
the third pixel-unit group and the fourth pixel-unit group have a same quantity of rows and a same quantity of columns in one matrix,
the sub-pixels in the first pixel-unit group are all first sub-pixels,
the sub-pixels in the second pixel-unit group are all second sub-pixels,
the sub-pixels in the third pixel-unit group include third sub-pixels and the second sub-pixels having a same quantity, and
the sub-pixels in the fourth pixel-unit group include the third sub-pixels and the first sub-pixels having a same quantity.

2. The array substrate according to claim 1, wherein:
each of the first pixel-unit group, the second pixel-unit group, the third pixel-unit group, and the fourth pixel-unit group includes four sub-pixels arranged into a 2×2 matrix;
the four sub-pixels in each third pixel-unit group include two third sub-pixels in a first row of the 2×2 matrix and two second sub-pixels in a second row of the 2×2 matrix; and
the four sub-pixels in each fourth pixel-unit group include two third sub-pixels in a first row of the 2×2 matrix and two first sub-pixels in a second row of the 2×2 matrix.

3. The array substrate according to claim 1, wherein:
each of the first pixel-unit group and the second pixel-unit group includes two sub-pixels arranged in a 2×1 matrix;
each of the third pixel-unit group and the fourth pixel-unit group includes four sub-pixels arranged in a 2×2 matrix;
the four sub-pixels in each third pixel-unit group include two third sub-pixels in a first row of the 2×2 matrix and two second sub-pixels in a second row of the 2×2 matrix; and
the four sub-pixels in each fourth pixel-unit group include two third sub-pixels in a first row of the 2×2 matrix and two first sub-pixels in a second row of the 2×2 matrix.

4. The array substrate according to claim 1, wherein:
each of the first pixel-unit group and the second pixel-unit group includes four sub-pixels arranged in a 2×2 matrix;

each of the third pixel-unit group and the fourth pixel-unit group includes two sub-pixels arranged in a 2×1 matrix;

the two sub-pixels in each third pixel-unit group include one third sub-pixel in a first row of the 2×1 matrix and one second sub-pixel in a second row of the 2×1 matrix; and the two sub-pixels in each fourth pixel-unit group include one third sub-pixel in a first row of the 2×1 matrix and one first sub-pixel in a second row of the 2×1 matrix.

5. The array substrate according to claim 1, wherein:

each of the first pixel-unit group, the second pixel-unit group, the third pixel-unit group, and the fourth pixel-unit group includes two sub-pixels arranged into a 2×1 matrix;

the two sub-pixels in each third pixel-unit group include one third sub-pixel in a first row of the 2×1 matrix and one second sub-pixel in a second row of the 2×1 matrix; and the two sub-pixels in each fourth pixel-unit group include one third sub-pixel in a first row of the 2×1 matrix and one first sub-pixel in a second row of the 2×1 matrix.

6. The array substrate according to claim 1, wherein:

the first sub-pixel, the second sub-pixel, and the third sub-pixel correspond to different colors, and each of the first sub-pixel, the second sub-pixel, and the third sub-pixel is one of a blue sub-pixel, a green sub-pixel, and a red sub-pixel.

7. The array substrate according to claim 1, wherein the first sub-pixels, the second sub-pixels, and the third sub-pixels all have a rectangular shape or all have a diamond shape.

8. The array substrate according to claim 1, wherein:

neighboring first sub-pixel, second sub-pixel, and third sub-pixel, together form one pixel unit; and two neighboring pixel units share one of a first sub-pixel, a second sub-pixel, and a third sub-pixel.

9. The array substrate according to claim 1, wherein:

the first pixel-unit groups are arranged in line with the third pixel-unit groups on the array substrate along the first direction; and the second pixel-unit groups are arranged in line with the fourth pixel-unit groups on the array substrate along the first direction.

10. The array substrate according to claim 1, wherein:

the first pixel-unit groups and the third pixel-unit groups are arranged along virtual zigzag lines on the array substrate in the first direction; and the second pixel-unit groups and the fourth pixel-unit groups are arranged along virtual zigzag lines on the array substrate in the first direction.

11. The array substrate according to claim 1, wherein the angle formed between the first direction and the second direction is 90 degrees.

12. A display panel containing the array substrate according to claim 1.

13. A display device containing the display panel according to claim 12.

14. The display device according to claim 13, wherein the display device is an organic light-emitting display device or a liquid crystal display device.

* * * * *